United States Patent
Kim et al.

(10) Patent No.: US 12,100,442 B2
(45) Date of Patent: *Sep. 24, 2024

(54) FLASH MEMORY DEVICE CONFIGURED TO BE BONDED TO EXTERNAL SEMICONDUCTOR CHIP AND COMPUTING DEVICE INCLUDING FLASH MEMORY DEVICE COUPLED TO NEURAL PROCESSOR CHIP

(71) Applicant: SAMSUNG ELECTRONICS CO., LTD., Suwon-si (KR)

(72) Inventors: Chanho Kim, Seoul (KR); Daeseok Byeon, Seongnam-si (KR); Hyunsurk Ryu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 328 days.

This patent is subject to a terminal disclaimer.

(21) Appl. No.: 17/682,100

(22) Filed: Feb. 28, 2022

(65) Prior Publication Data

US 2022/0180917 A1    Jun. 9, 2022

Related U.S. Application Data

(63) Continuation of application No. 17/006,990, filed on Aug. 31, 2020, now Pat. No. 11,270,759, and a (Continued)

(30) Foreign Application Priority Data

Oct. 21, 2019  (KR) .......................... 10-2019-0130745

(51) Int. Cl.
  *G11C 11/4093* (2006.01)
  *G06N 3/063* (2023.01)
  (Continued)

(52) U.S. Cl.
  CPC .......... *G11C 11/4093* (2013.01); *G06N 3/063* (2013.01); *G11C 5/06* (2013.01);
  (Continued)

(58) Field of Classification Search
  CPC ........................... G11C 16/0483; G11C 16/08
  (Continued)

(56) References Cited

U.S. PATENT DOCUMENTS 7,679,133 B2   3/2010   Son et al.
8,553,466 B2   10/2013  Han et al.
(Continued)

FOREIGN PATENT DOCUMENTS

KR   10-2016-0069584 A   6/2016
KR   10-2019-0041319 A   4/2019
KR   10-2019-0059057 A   5/2019

OTHER PUBLICATIONS

Kang-Deog Suh et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156, 8 pages total.

*Primary Examiner* — Connie C Yoha
(74) *Attorney, Agent, or Firm* — Sughrue Mion, PLLC

(57) ABSTRACT

Flash memory device includes: first pads to be bonded to external semiconductor chip, to receive at least one of command, address and control signals; second pads to be bonded to external semiconductor chip; memory cell array including memory cells; a row decoder block connected to memory cell array through word lines, to select one of word lines based on address provided to row decoder block; a buffer block to store command and address and provide address to row decoder block; a page buffer block connected to memory cell array through bit lines, connected to second pads through data lines without passing through buffer (Continued)

block, and configured to exchange data signals with external semiconductor chip through data lines and second pads; and a control logic block configured to receive command from buffer block, to receive control signals from external semiconductor chip, and to control row decoder block and page buffer block.

20 Claims, 15 Drawing Sheets

Related U.S. Application Data continuation of application No. 16/871,815, filed on May 11, 2020, now Pat. No. 11,264,084, said application No. 17/006,990 is a continuation-in-part of application No. 16/871,815, filed on May 11, 2020, now Pat. No. 11,264,084.

(51) Int. Cl.
| | | |
|---|---|---|
| *G11C 5/06* | (2006.01) | |
| *G11C 11/408* | (2006.01) | |
| *G11C 11/4094* | (2006.01) | |
| *G11C 16/04* | (2006.01) | |
| *G11C 16/08* | (2006.01) | |

(52) U.S. Cl.
CPC ...... *G11C 11/4082* (2013.01); *G11C 11/4085* (2013.01); *G11C 11/4087* (2013.01); *G11C 11/4094* (2013.01); *G11C 16/0483* (2013.01); *G11C 16/08* (2013.01)

(58) Field of Classification Search
USPC .................................................. 365/189.05
See application file for complete search history.

(56) References Cited

U.S. PATENT DOCUMENTS

| | | | |
|---|---|---|---|
| 8,559,235 | B2 | 10/2013 | Yoon et al. |
| 8,654,587 | B2 | 2/2014 | Yoon et al. |
| 8,676,734 | B2 | 3/2014 | Aparin |
| 9,424,928 | B2 | 8/2016 | Hwang et al. |
| 9,558,945 | B2 | 1/2017 | Fukuzumi et al. |
| 10,339,444 | B2 | 7/2019 | Hosokawa et al. |
| 10,712,955 | B2 | 7/2020 | Jeon et al. |
| 10,777,279 | B2 | 9/2020 | Lee et al. |
| 11,264,084 | B2 * | 3/2022 | Kim ..................... G11C 11/4093 |
| 11,270,759 | B2 * | 3/2022 | Kim ....................... G11C 16/08 |
| 2007/0189050 | A1 | 8/2007 | Seo et al. |
| 2010/0167467 | A1 | 7/2010 | Aoi |
| 2011/0121433 | A1 | 5/2011 | Kim |
| 2011/0233648 | A1 | 9/2011 | Seol et al. |
| 2015/0108637 | A1 * | 4/2015 | Usami ...................... G11C 5/02 |
| | | | 257/737 |
| 2017/0228634 | A1 | 8/2017 | Tomita |
| 2018/0102251 | A1 | 4/2018 | Delacruz et al. |
| 2018/0226453 | A1 | 8/2018 | Yi |
| 2018/0336451 | A1 | 11/2018 | Park et al. |
| 2019/0043836 | A1 | 2/2019 | Fastow et al. |
| 2019/0065410 | A1 | 2/2019 | Bigioi et al. |
| 2019/0130974 | A1 * | 5/2019 | Kim ..................... G11C 11/4097 |
| 2019/0164038 | A1 | 5/2019 | Zhang |
| 2019/0214365 | A1 | 7/2019 | Gu et al. |
| 2021/0066143 | A1 * | 3/2021 | Jung ....................... H01L 25/18 |
| 2021/0124693 | A1 * | 4/2021 | Kim ....................... G11C 16/10 |

* cited by examiner

FLASH MEMORY DEVICE CONFIGURED TO BE BONDED TO EXTERNAL SEMICONDUCTOR CHIP AND COMPUTING DEVICE INCLUDING FLASH MEMORY DEVICE COUPLED TO NEURAL PROCESSOR CHIP

CROSS-REFERENCE TO RELATED APPLICATIONS

This is a continuation of U.S. application Ser. No. 16/871,815 filed May 11, 2020 and a continuation of U.S. application Ser. No. 17/006,990 filed Aug. 31, 2020, which is a continuation-in-part of U.S. application Ser. No. 16/871,815 filed May 11, 2020 which claims priority under 35 U.S.C. § 119 to Korean Patent Application No. 10-2019-0130745, filed on Oct. 21, 2019 in the Korean Intellectual Property Office. The disclosures of the above-named applications are incorporated by reference herein in their entireties.

BACKGROUND

Apparatuses and methods consistent with one or more exemplary embodiments relate to a semiconductor device, and more particularly, to a flash memory device providing a super wide bandwidth for neural processing and a computing device including flash memory cells.

As technologies associated with machine learning develop, there is an attempt to apply the machine learning to applications in an environment. As an example of the attempt to apply the machine learning to applications, a processing element and a storage element that are appropriate to adopt the machine learning are being developed.

The machine learning has a structural characteristic using a large amount of sequential data. As a large amount of sequential data are conveyed at a high speed or with a wide bandwidth, the performance of machine learning-adopted applications may be improved, and the utilization may increase. Also, to reduce unnecessary power consumption, a nonvolatile storage element may be used as a storage element for the machine learning.

A nonvolatile storage element that conveys a large amount of sequential data at a high speed or with a wide bandwidth to such an extent as to be appropriate for the machine learning has not been developed. Accordingly, there is an increasing demand on a nonvolatile storage element that conveys a large amount of sequential data at a high speed or with a wide bandwidth to such an extent as to be appropriate for the machine learning.

SUMMARY

Aspects of one or more exemplary embodiments provide a flash memory device having a performance appropriate for machine learning by conveying a large amount of sequential data at a high speed or with a wide bandwidth and a computing device including flash memory cells.

According to an aspect of an exemplary embodiment, a flash memory device includes: first pads configured to be bonded to an external semiconductor chip; second pads configured to be bonded to the external semiconductor chip; third pads configured to be bonded to the external semiconductor chip; a memory cell region including first metal pads and a memory cell array including memory cells; and a peripheral circuit region including a second metal pads and vertically connected to the memory cell region by the first metal pads and the second metal pads directly. The peripheral circuit region includes a row decoder block connected to the memory cell array through word lines, and configured to select one of the word lines based on an address provided to the row decoder block; a buffer block configured to store a command and the address received, through the first pads, from the external semiconductor chip and to provide the address to the row decoder block; a page buffer block connected to the memory cell array through bit lines, connected to the third pads through data lines, and configured to exchange data signals with the external semiconductor chip through the data lines and the third pads; and a control logic block configured to receive the command from the buffer block, to receive control signals from the external semiconductor chip through the second pads, and to control the row decoder block and the page buffer block based on the received command and the received control signals.

According to an aspect of another exemplary embodiment, a computing device includes: a memory cell chip including first metal pads and flash memory cells; a peripheral circuit chip including second metal pads and configured to access the flash memory cells; and a logic chip configured to store, through the peripheral circuit chip, first data in the flash memory cells, to read second data from the flash memory cells, and to perform at least one operation by using the first data and the second data, wherein the peripheral circuit chip is vertically connected to the memory cell chip by the first metal pads and the second metal pads directly, and wherein the peripheral circuit chip and the memory cell chip, which are coupled, is stacked on the logic chip.

According to an aspect of another exemplary embodiment, a computing device includes: a neural processor chip; and a flash memory chip coupled to the neural processor chip, wherein the flash memory chip includes: first pads bonded to the neural processor chip; second pads bonded to the neural processor chip; third pads bonded to the neural processor chip; a memory cell region including first metal pads and a memory cell array including memory cells; and a peripheral circuit region including a second metal pads and vertically connected to the memory cell region by the first metal pads and the second metal pads directly, wherein the peripheral circuit region includes: a row decoder block connected to the memory cell array through word lines, and configured to select one of the word lines based on an address provided to the row decoder block; a buffer block configured to store a command and the address received, through the first pads, from the neural processor chip and to provide the address to the row decoder block; a page buffer block connected to the memory cell array through bit lines, connected to the third pads through data lines, and configured to exchange data signals with the neural processor chip through the data lines and the third pads; and a control logic block configured to receive the command from the buffer block, to receive control signals from the neural processor chip through the second pads, and to control the row decoder block and the page buffer block based on the received command and the received control signals.

According to an aspect of another exemplary embodiment, a flash memory device includes: memory cells; first pads configured to be bonded to an external semiconductor chip and configured to receive, from the external semiconductor chip, a command and an address for a read or write operation with respect to the memory cells; second pads configured to be bonded to the external semiconductor chip and to receive control signals from the external semiconductor chip; third pads configured to be bonded to the external semiconductor chip; and a page buffer block connected to the memory cells through bit lines, connected to the third pads through data lines, and configured to exchange data signals with the external semiconductor chip through the data lines and the third pads.

BRIEF DESCRIPTION OF THE DRAWINGS

The above and other objects and will become apparent by describing in detail exemplary embodiments with reference to the accompanying drawings, in which.

DETAILED DESCRIPTION

Below, exemplary embodiments may be described in detail and clearly to such an extent that one of ordinary skill in the art can easily implement the inventive concept(s).

Figure 1:
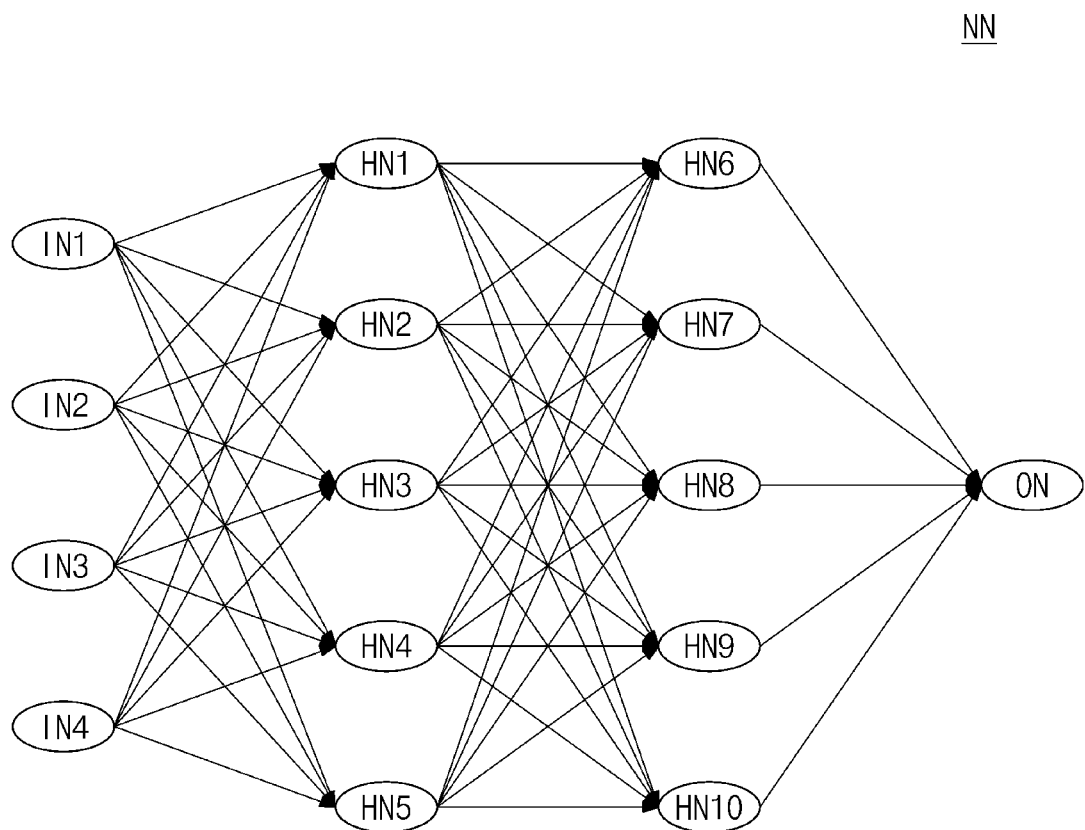
FIG. 1 illustrates an example of a neural network implemented based on machine learning.

FIG. 1 illustrates an example of a neural network NN implemented based on machine learning. For example, the neural network NN may include various implementations such as an artificial neural network (ANN), a convolution neural network (CNN), a recursive neural network (RNN), etc.

Referring to FIG. 1, the neural network NN includes first to fourth input nodes IN1 to IN4, first to tenth hidden nodes HN1 to HN10, and an output node ON. The number of input nodes, the number of hidden nodes, and the number of output nodes may be determined in advance when constructing the neural network.

The first to fourth input nodes IN1 to IN4 form an input layer. The first to fifth hidden nodes HN1 to HN5 form a first hidden layer. The sixth to tenth hidden nodes HN6 to HN10 form a second hidden layer. The output node ON forms an output layer. The number of hidden layers may be determined in advance when constructing the neural network.

Data for learning or inference may be input to the first to fourth input nodes IN1 to IN4. A value of each input node is transferred to the first to fifth hidden nodes HN1 to HN5 of the first hidden layer through branches (or synapses). Each of the branches (or synapses) may be designated to have the corresponding synapse value or the corresponding weight. Calculation (e.g., multiplication) may be performed on a value of each input node and the synapse value or weight of the corresponding branch (or synapse), and a result of the calculation may be transferred to the first hidden layer.

Calculation (e.g., multiplication) may be performed on values of the first to fifth hidden nodes HN1 to HN5 and weights (or synapse values), and a result of the calculation may be transferred to the sixth to tenth hidden nodes HN6 to HN10 of the second hidden layer. Calculation (e.g., multiplication) may be performed on inputs of the sixth to tenth hidden nodes HN6 to HN10 and weights (or synapse values), and a result of the calculation may be transferred to the output node ON. A value of the output node ON may indicate a result of learning or inference.

Figure 2:
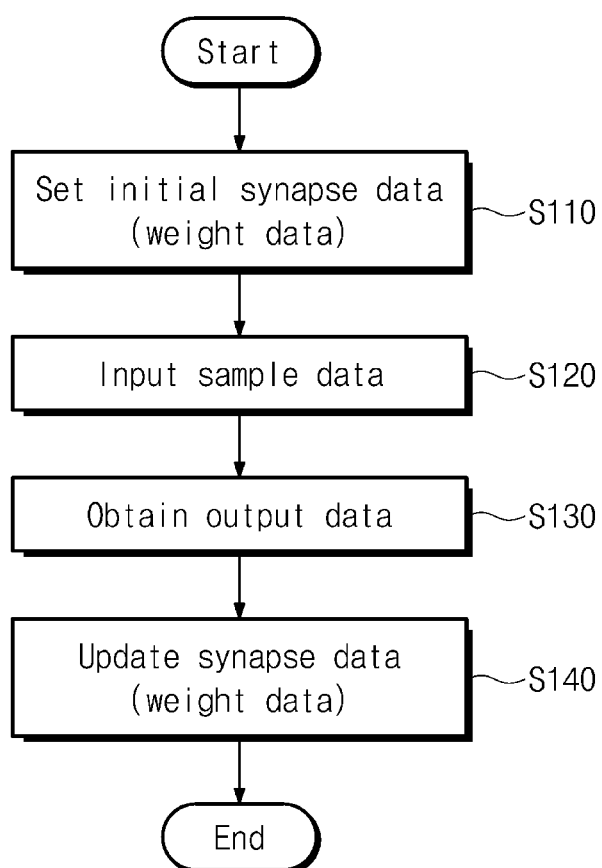
FIG. 2 illustrates an example in which machine learning is performed at a neural network of FIG. 1.

FIG. 2 illustrates an example in which machine learning is performed at the neural network NN of FIG. 1. Referring to FIGS. 1 and 2, in operation S110, initial synapse data (or initial weight data) may be set or provided to the neural network NN. The initial synapse data (or initial weight data) may include a plurality of initial synapse values (or initial weight values) corresponding to a plurality of synapses (or branches), respectively.

For example, the initial synapse data (or initial weight data) are read from a storage element (or storage device, memory, etc.), and the read initial synapse data (or initial weight data) are loaded onto a neural processing unit (NPU). The initial synapse data (or initial weight data) may be a large amount of data of tens of megabytes MB or more.

In operation S120, sample data for the machine learning are input to the NPU. The sample data may be input to the NPU through a communication means or device such as a modem, a communication interface, a network interface, etc. Alternatively, the sample data may be input from the storage element to the NPU. In this case, the sample data may be read from the storage element, and the read sample data may be loaded onto the NPU. The sample data may be a large amount of data of tens of megabytes MB or more.

In operation S130, the NPU may obtain output data. The output data may be transferred or transmitted to a remote site through a communication means or device such as a modem, a communication interface, a network interface, etc., or may be stored in the storage element. In this case, the output data may be received from the NPU, and the received output data may be stored in the storage element. The output data may be a large amount of data of several megabytes MB or more.

In operation S140, synapse data (or weight data) may be updated based on a difference between the output data and the sample data. In this case, the synapse data (or weight data) present in the storage element are overwritten. The synapse data (or weight data) may be a large amount of data of tens of megabytes MB or more.

Figure 3:
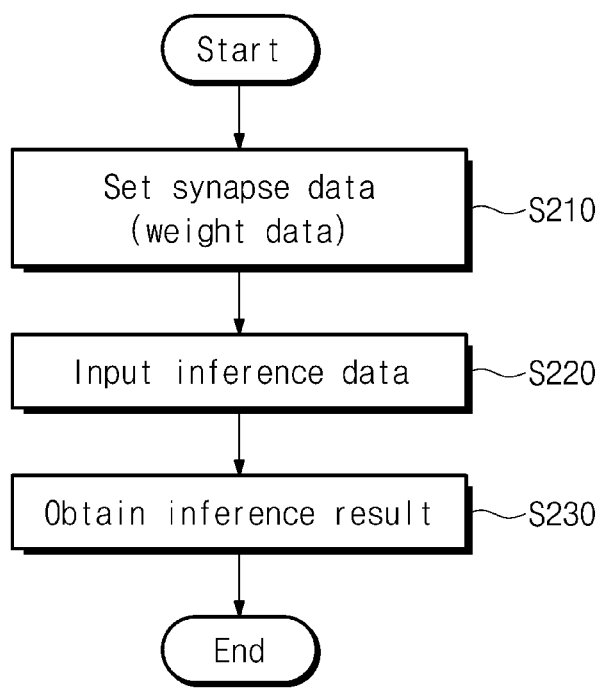
FIG. 3 illustrates an example in which inference is performed at a neural network of FIG. 1.

FIG. 3 illustrates an example in which inference is performed at the neural network NN of FIG. 1. Referring to FIGS. 1 and 3, in operation S210, synapse data (or weight data) may be set or provided to the NPU. In this case, the synapse data (or weight data) are read from a storage element, and the read synapse data (or weight data) are loaded onto the NPU. The synapse data (or weight data) may be a large amount of data of tens of megabytes MB or more.

In operation S220, inference data for inference are input to the NPU. The inference data may be input to the NPU through a communication means or device such as a modem, a communication interface, a network interface, etc. Alternatively, the inference data may be input from the storage element to the NPU. In this case, the inference data may be read from the storage element, and the read inference data may be loaded onto the NPU. The inference data may be a large amount of data of tens of megabytes MB or more.

In operation S230, the NPU may obtain output data (or an inference result). The output data may be transmitted to a remote site through a communication means such as a modem or may be stored in the storage element. In this case, the output data may be received from the NPU, and the received output data may be stored in the storage element. The output data may be a large amount of data of several megabytes MB or more.

When additional inference is performed by using the same inference model later, operation S220 and operation S230 may be repeated. When a current inference model (e.g., an image recognition model) is changed to another inference model (e.g., a voice recognition model), operation S210 to operation S230 may be repeated.

As described with reference to FIGS. 2 and 3, in the machine learning and inference process, read and write operations for a large amount of data (or mass read and write operations) may be performed on the storage element associated with the NPU. Because the read and write operations for a large amount of data (or mass read and write operations) are associated with each of synapse data (or weight data), sample data, inference data, and output data, the read and write operations for a large amount of data (or mass read and write operations) have a sequential characteristic, not a random characteristic.

One or more exemplary embodiments provide a flash memory device and a computing device supporting a sequential read operation and a sequential write operation for a large amount of data by providing a super wide bandwidth with regard to data with an interface associated with a command, an address, and control signals maintained. Accordingly, there may be provided a flash memory device appropriate for the NPU, with additional costs according to a change of an interface of an existing flash memory device suppressed or minimized.

Figure 4:
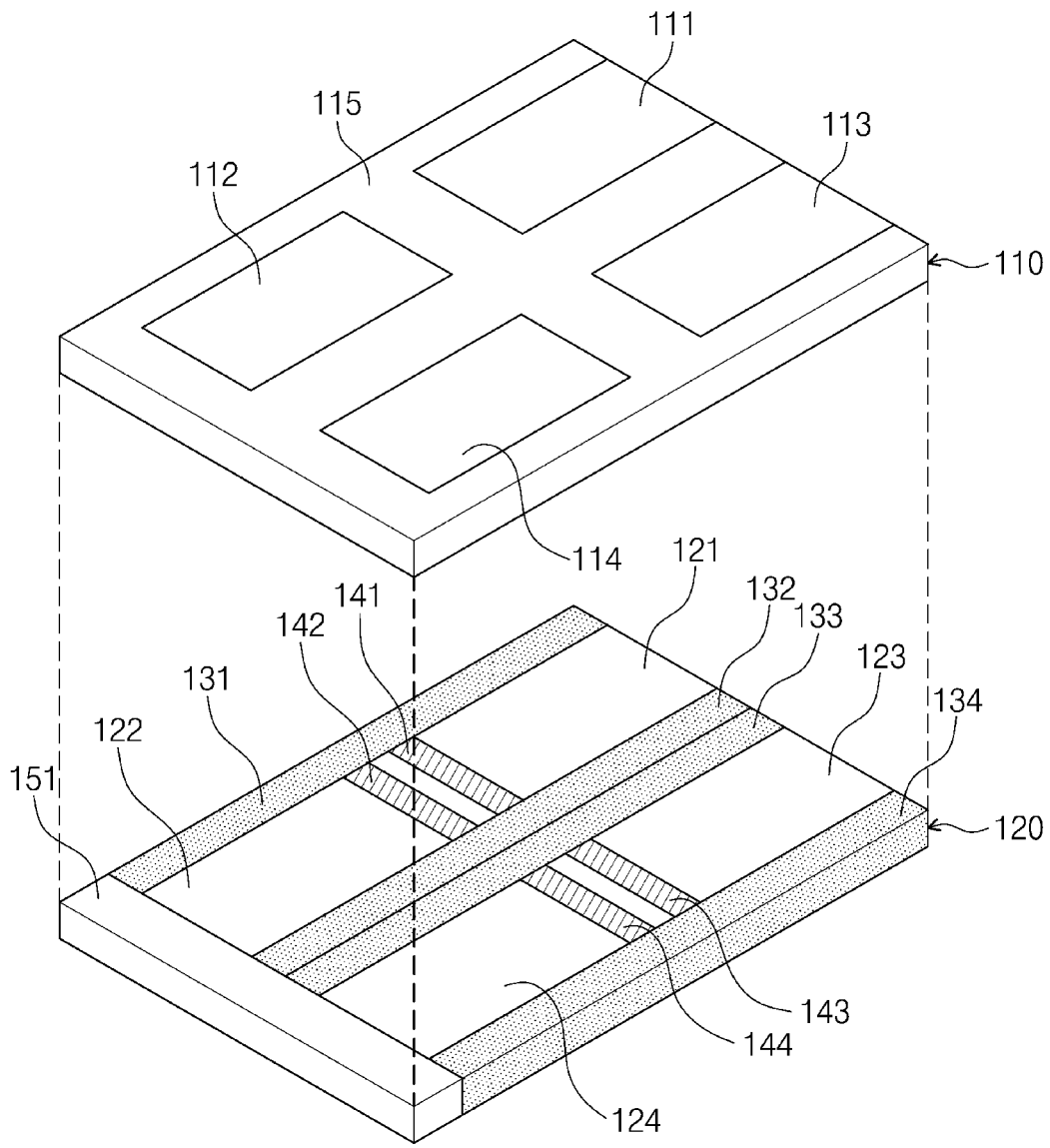
FIG. 4 is a perspective view illustrating a flash memory device according to an exemplary embodiment.

FIG. 4 is a perspective view illustrating a flash memory device 100 according to an exemplary embodiment. Referring to FIG. 4, the flash memory device 100 may include a first layer 110 and a second layer 120. Each of the first layer 110 and the second layer 120 may be parallel to a plane defined by a first direction and a second direction. Each of the first layer 110 and the second layer 120 may have an upper surface facing a third direction and a lower surface facing away from the upper surface.

For convenience of description, the example illustrated in FIG. 4 shows the first layer 110 and the second layer 120 separated from each other. However, the first layer 110 and the second layer 120 may be closely attached along the third direction so as to be implemented with one structure.

The first layer 110 may be a memory cell array including flash memory cells. The first layer 110 may include a first array 111, a second array 112, a third array 113, a fourth array 114, and an outer area 115 surrounding the first to fourth arrays 111 to 114. Each of the first to fourth arrays 111 to 114 may include a plurality of memory cells, and selection lines, word lines, and bit lines connected to the plurality of memory cells.

The second layer 120 may be or include peripheral circuits for accessing the flash memory cells. The second layer 120 may include a first internal area 121, a second internal area 122, a third internal area 123, and a fourth internal area 123. The second layer 120 may further include a first row decoder 131 that extends along the second direction on one side of the first and second internal areas 121 and 122, which faces away from the first direction.

The second layer 120 may further include a second row decoder 132 and a third row decoder 133 that are sequentially disposed along the first direction between the first and third internal areas 121 and 123 and between the second and fourth internal areas 122 and 124 and extend along the second direction. The second layer 120 may further include a fourth row decoder 134 that extends along the second direction on one side of the third and fourth internal areas 123 and 124, which faces the first direction.

The second layer 120 may further include a first page buffer 141 and a second page buffer 142 that are sequentially disposed along the second direction between the first and second internal areas 121 and 122 and extend along the first direction.

The second layer 120 may further include a third page buffer 143 and a fourth page buffer 144 that are sequentially disposed along the second direction between the third and fourth internal areas 123 and 124 and extend along the first direction.

The second layer 120 may further include an outer area 151 that extends along the first direction on one side of the first to fourth row decoders 131 to 134 and the second and fourth internal areas 122 and 124, which faces away from the second direction.

For example, the flash memory device 100 may be based on a cell-over-peri (COP) structure. A first active area may be formed on a semiconductor substrate, and the second layer 120 may be formed on the first active area. A second active area may be formed on the second layer 120, and the first layer 110 may be formed on the second active area.

The first to fourth row decoders 131 to 134 may be electrically connected with the word lines and the selection lines of the first layer 110 by using through vias (e.g., through hole vias (THV)) that are extended along the third direction and penetrate the corresponding portions of the outer area 115 of the first layer 110. The first to fourth page buffers 141 to 144 may be electrically connected with the bit lines of the first layer 110 by using through vias that are extended along the third direction and penetrate the corresponding portions of the outer area 115 of the first layer 110.

For example, portions of the first and second row decoders 131 and 132, which face the second direction, and the first page buffer 141 may be respectively connected with the selection lines, the word lines, and the bit lines of the first array 111. The remaining portions of the first and second row decoders 131 and 132, which face away from the second direction, and the second page buffer 142 may be respectively connected with the selection lines, the word lines, and the bit lines of the second array 112.

Portions of the third and fourth row decoders 133 and 134, which face the second direction, and the third page buffer 143 may be respectively connected with the selection lines, the word lines, and the bit lines of the third array 113. The remaining portions of the third and fourth row decoders 133 and 134, which face away from the second direction, and the fourth page buffer 144 may be respectively connected with the selection lines, the word lines, and the bit lines of the fourth array 114.

Locations of the first to fourth internal areas 121 to 124 of the second layer 120 may correspond to locations of the first to fourth arrays 111 to 114 of the first layer 110, respectively. The first to fourth internal areas 121 to 124 may include circuits for controlling accesses to the first to fourth arrays 111 to 114.

By way of another example, the flash memory device 100 may be implemented by wafer level bonding. The first layer 110 may be implemented with one of dies on a separate wafer (e.g., a first wafer). The selection lines, the word lines, and the bit lines of the first layer 110 may extend to a lower surface of the first layer 110 along a direction facing away from the third direction and may be respectively connected with pads (or solder bumps).

The second layer 120 may be implemented with one of dies on a separate wafer (e.g., a second wafer). The first to fourth row decoders 131 to 134 and the first to fourth page buffers 141 to 144 of the second layer 120 may be respectively connected with pads (or solder bumps) on an upper surface of the second layer 120 through wires extended along the third direction.

Locations of the pads (or solder bumps) of the first layer 110 on the first wafer may correspond to locations of the pads (or solder bumps) of the second layer 120 on the second wafer. The dies on the first wafer and the dies on the second wafer may be coupled to each other by bonding the first wafer and the second wafer.

The flash memory device 100 may be implemented by cutting the coupled wafers. In this case, the first layer 110 of the flash memory device 100 may be regarded as a flash memory cell chip, and the second layer 120 thereof may be regarded as a peripheral circuit chip.

Figure 5:
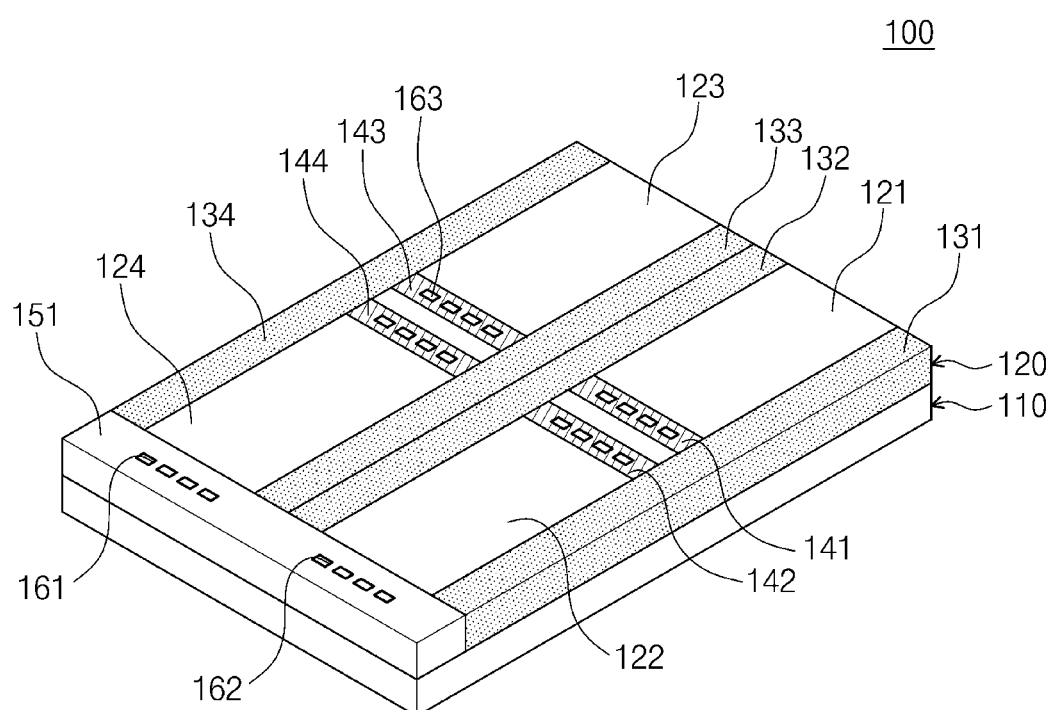
FIG. 5 illustrates an example of a flash memory device of FIG. 4 rotated around a second direction as much as 180 degrees.
Figure 5:
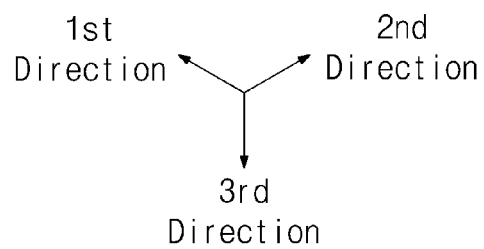

FIG. 5 illustrates an example of the flash memory device 100 of FIG. 4 rotated around the second direction by approximately 180 degrees. In the example illustrated in FIG. 5 the first layer 110 and the second layer 120 are closely attached along the third direction so as to be implemented with one structure.

Referring to FIGS. 4 and 5, first pads 161 (or solder bumps) and second pads 162 (or solder bumps) are disposed on a lower surface of the outer area 151 of the second layer 120 (or on a surface of the outer area 151, which faces away from the third direction). The first pads 161 and the second pads 162 may be coupled to an external device (e.g., an NPU).

The first pads 161 may be configured to receive a command and an address of the flash memory device 100. The second pads 162 may be configured to receive and output control signals of the flash memory device 100. The first pads 161 and the second pads 162 may receive and transfer a command, an address, and control signals in compliance with an interface of a general flash memory device.

Third pads 163 (or solder bumps) are disposed on a lower surface of the first to fourth page buffers 141 to 144 of the second layer 120 (or on a surface of the first to fourth page buffers 141 to 144, which faces away from the third direction). The third pads 163 may be coupled to the external device (e.g., an NPU). The third pads 163 may be directly connected to internal circuits of the first to fourth page buffers 141 to 144 without passing through any other components. The third pads 163 may support direct communication between the external device (e.g., the NPU) and the first to fourth page buffers 141 to 144, thus providing a super wide bandwidth for data.

In the present exemplary embodiment, the flash memory device 100 is described as being implemented with the COP structure or by bonding wafers. It is understood, however, that one or more other exemplary embodiments are not limited to the COP structure or the way to bond wafers. For example, the flash memory device 100 may be implemented such that the first pads 161, the second pads 162, and the third pads 163 are disposed on the same surface so as to be coupled to the external device (e.g., an NPU).

Figure 6:
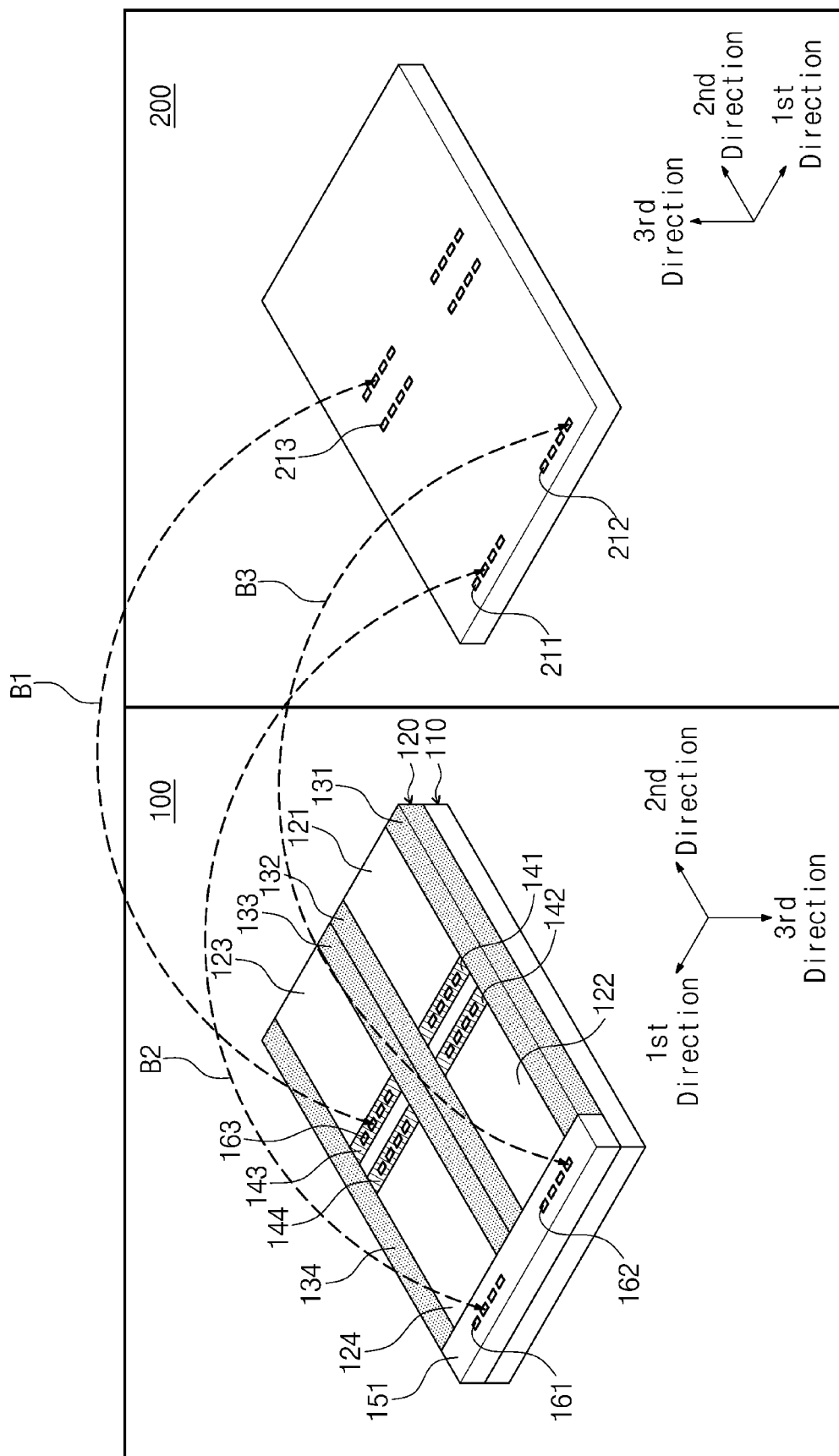
FIG. 6 illustrates an example in which a flash memory device according to an exemplary embodiment is coupled to an external device, for example, a neural processing unit (NPU)

FIG. 6 illustrates an example in which the flash memory device 100 according to an exemplary embodiment is coupled to an external device, for example, a neural processing unit (NPU) 200. Referring to FIG. 6, in a right section, the NPU 200 may include an upper surface that is parallel to the first direction and the second direction and is formed to face the third direction. The NPU 200 may further include a lower surface that is formed to face away from the third direction.

First pads 211 (or solder bumps), second pads 212 (or solder bumps), and third pads 213 (or solder bumps) may be disposed on the upper surface of the NPU 200. A location relationship of the first pads 211, the second pads 212, and the third pads 213 of the NPU 200 may be identical to (or corresponding to) a location relationship of the first pads 161, the second pads 162, and the third pads 163 on the lower surface (e.g., on a surface parallel to the first direction and the second direction and facing away from the third direction) of the flash memory device 100 in the left section of FIG. 6.

As illustrated by first to third bonding lines B1 to B3, the flash memory device 100 may be rotated around the second direction by approximately 180 degrees, and the lower surface of the flash memory device 100 may be coupled to the upper surface of the NPU 200.

As illustrated by the second bonding line B2, the first pads 161 (or solder bumps) on the lower surface of the flash memory device 100 may be bonded to the first pads 211 (or solder bumps) on the upper surface of the NPU 200. The NPU 200 may transfer a command and an address to the flash memory device 100 through the first pads 211 and 161. For example, the command and the address may be transferred in units of one byte (i.e., 8 bits) in one cycle (e.g., a clock cycle or a cycle of a toggle signal equivalent to the clock cycle).

As illustrated by the third bonding line B3, the second pads 162 (or solder bumps) on the lower surface of the flash memory device 100 may be bonded to the second pads 212 (or solder bumps) on the upper surface of the NPU 200. Through the second pads 212 and 162, the NPU 200 may transfer control signals to the flash memory device 100 and may receive control signals from the flash memory device 100.

As illustrated by the first bonding line B1, the third pads 163 (or solder bumps) on the lower surface of the flash memory device 100 may be bonded to the third pads 213 (or solder bumps) on the upper surface of the NPU 200. The NPU 200 may perform data communication with the flash memory device 100 through the third pads 213 and 163. For example, the data may be transferred in units of hundreds bytes or more (or thousands bytes or more) in one cycle (e.g., a clock cycle or a cycle of a toggle signal equivalent to the clock cycle).

In an exemplary embodiment, the flash memory device 100 and the NPU 200 may be coupled through wafer level bonding. For example, a wafer including a die (e.g., a COP die or a die bonded at a wafer level) of the flash memory device 100 and a wafer including a die of the NPU 200 may be coupled and may then be cut.

By way of another example, the flash memory device 100 and the NPU 200 may be coupled through chip level bonding. For example, a chip (e.g., a COP chip or a chip implemented through the bonding and separation at a wafer level) of the flash memory device 100 and a chip of the NPU 200 may be prepared separately. Afterwards, the chip of the flash memory device 100 and the chip of the NPU 200 may be coupled through the bonding.

Further, by way of still another example, the flash memory device 100 and the NPU 200 may be coupled through the chip and wafer level bonding. For example, a chip (e.g., a COP chip or a chip implemented through the bonding and separation at a wafer level) of the flash memory device 100 may be prepared. The chip of the flash memory device 100 may be coupled to a wafer including the chip of the NPU 200 for every die, and the dies may be separated.

The NPU 200 may further include pads (or solder bumps) that are coupled to another external device, for example, an upper host device, such as an application processor or a central processing unit, on the lower surface of the NPU 200 or on the upper surface of the NPU 200 not covered by the flash memory device 100. In this case, there may be implemented a hierarchical structure in which the NPU 200 performs learning or inference by using the flash memory device 100 depending on a request of the upper host device.

Figure 7:
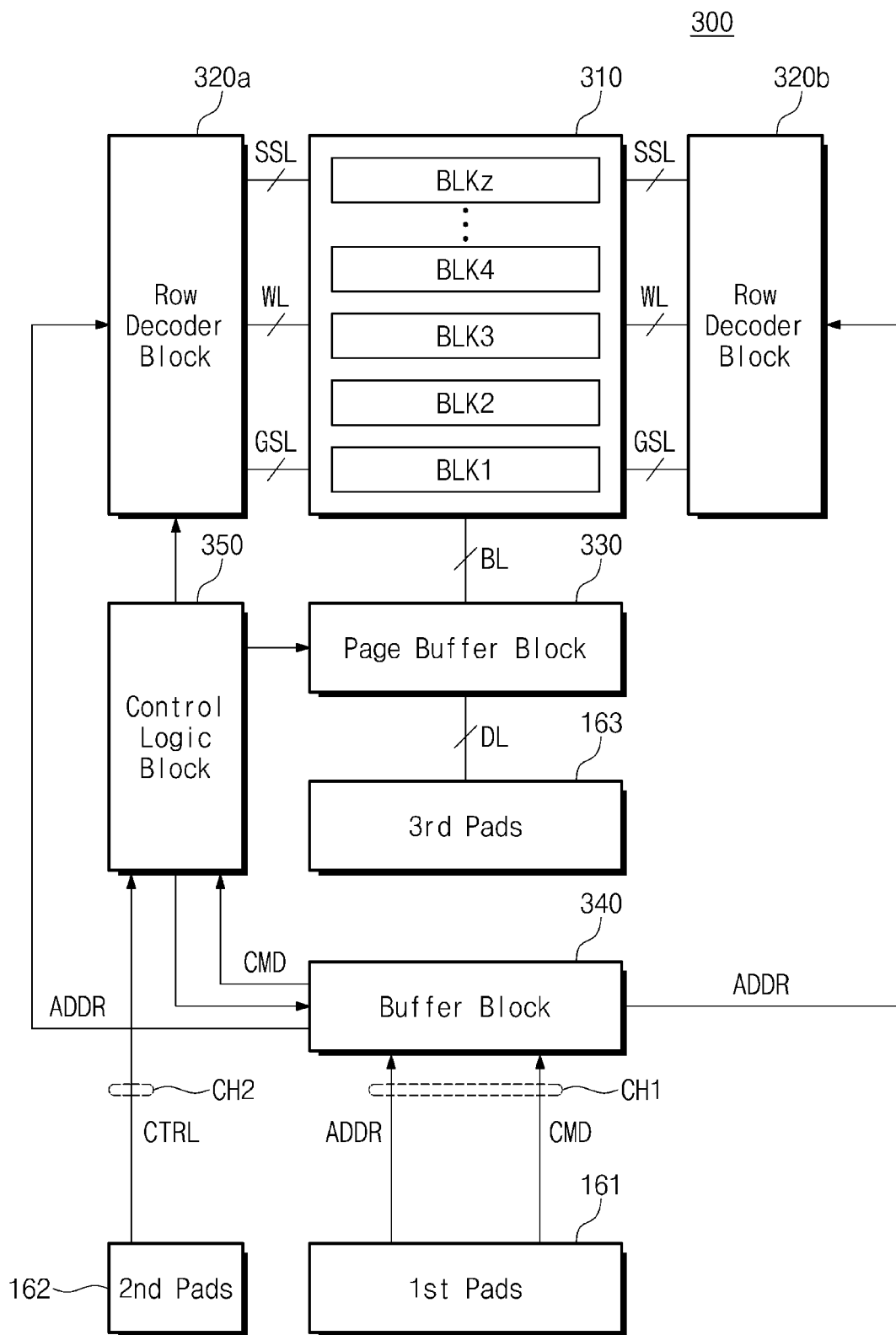
FIG. 7 is a block diagram illustrating a flash memory device according to an exemplary embodiment.

FIG. 7 is a block diagram illustrating a flash memory device 300 according to an exemplary embodiment. FIG. 7 illustrates a block diagram of components corresponding to one of the first to fourth arrays 111 to 114 of the flash memory device 100 described with reference to FIGS. 4 to 6. Referring to FIGS. 4 and 7, the flash memory device 300 may include a memory cell array 310, row decoder blocks 320a and 320b, a page buffer block 330, a buffer block 340, a control logic block 350, the first pads 161, the second pads 162, and the third pads 163.

The memory cell array 310 may correspond to one of the first to fourth arrays 111 to 114. The memory cell array 310 includes a plurality of memory blocks BLK1 to BLKz. Each of the memory blocks BLK1 to BLKz includes a plurality of memory cells. Each of the memory blocks BLK1 to BLKz may be connected to the row decoder blocks 320a and 320b through at least one ground selection line GSL, word lines WL, and at least one string selection line SSL. Ground selection lines and string selection lines may be included in the selection lines described with reference to FIG. 4.

Some of the word lines WL may be used as dummy word lines. Each of the memory blocks BLK1 to BLKz may be connected to the page buffer block 330 through a plurality of bit lines BL. The plurality of memory blocks BLK1 to BLKz may be connected in common to the plurality of bit lines BL.

In an exemplary embodiment, each of the memory blocks BLK1 to BLKz may be a unit of an erase operation. The memory cells belonging to each of the memory blocks BLK1 to BLKz may be erased at the same time. By way of another example, each of the plurality of memory blocks BLK1 to BLKz may be divided into a plurality of sub-blocks. Each of the plurality of sub-blocks may correspond to a unit of an erase operation.

The row decoder blocks 320a and 320b may be implemented with portions corresponding to a particular array (e.g., an array corresponding to the memory cell array 310) from among the portions of the first to fourth row decoders 131 to 134 of FIG. 4. The row decoder blocks 320a and 320b are connected to the memory cell array 310 through ground selection lines GSL, the word lines WL, and string selection lines SSL. The row decoder blocks 320a and 320b operate under control of the control logic block 350.

The row decoder blocks 320a and 320b may decode an address ADDR received from the buffer block 340 and may control voltages to be applied to the string selection lines SSL, the word lines WL, and the ground selection lines GSL based on the decoded address.

The page buffer block 330 may be implemented with a page buffer corresponding to a particular array (e.g., an array corresponding to the memory cell array 310) from among the first to fourth page buffers 141 to 144. The page buffer block 330 is connected to the memory cell array 310 through the plurality of bit lines BL. The page buffer block 330 is connected with the third pads 163 through a plurality of data lines DL. The page buffer block 330 operates under control of the control logic block 350.

The buffer block 340 may receive a command CMD and an address ADDR from an external device (e.g., an NPU) through a first channel CH1 implemented by the first pads 161. The buffer block 340 may operate under control of the control logic block 350. The buffer block 340 may transfer the command CMD to the control logic block 350. The buffer block 340 may transfer the address ADDR to the row decoder blocks 320a and 320b.

The control logic block 350 may exchange a control signal CTRL with the external device (e.g., an NPU) through a second channel CH2 implemented by the second pads 162. The control logic block 350 may allow the buffer block 340 to route the command CMD and the address ADDR.

In a write operation, the page buffer block 330 may receive and store data to be written in memory cells through the third pads 163. Also, in the write operation, the buffer block 340 may receive the command CMD and the address ADDR through the first pads 161.

Because the data in the write operation are received through the third pads 163 separated from the first pads 161 through which the command CMD and the address ADDR are received, the flash memory device 300 may receive the data asynchronously with regard to the command CMD and the address ADDR. For example, the flash memory device 300 may receive the command CMD and the address ADDR through the first pads 161 before or after receiving data through the third pads 163.

In the write operation, the page buffer block 330 may apply voltages to the plurality of bit lines BL based on the stored data. The row decoder blocks 320a and 320b may apply the voltages for the write operation to the string selection lines SSL, the word lines WL, and the ground selection lines GSL based on the address ADDR.

In a read operation, the row decoder blocks 320a and 320b may apply voltages for the read operation to the string selection lines SSL, the word lines WL, and the ground selection lines GSL based on the address ADDR. The page buffer block 330 may latch (e.g., digitize) and store voltages of the bit lines BL and may output the stored data to the external device (e.g., an NPU) through the third pads 163.

The flash memory device 300 performs the write operation and the read operation in units of a page. A page may include memory cells connected to one word line. In general, thousands to tens of thousands of memory cells may be connected to one word line, and the number of memory cells connected to one word line may further increase with the development of technologies.

In the write operation, the flash memory device 300 may write two or more logical pages at one page. The logical pages are virtual pages that are generated as two or more bits are written at one memory cell. An n-th logical page (n being a positive integer) may be implemented with n-th bits of bits written at memory cells.

In the read operation, the flash memory device 300 may read two or more logical pages from one page. That is, the flash memory device 300 is possible to write and read bits, the number of which is a multiple of the number of memory cells included in one page. Accordingly, the flash memory device 300 may have a great strength in reading and writing data considered as one chunk due to a sequential characteristic.

Synapse data (or weight data), sample data, inference data, etc., used at the NPU all have mass and sequential characteristics. The flash memory device 300 according to an exemplary embodiment may include the third pads 163 implemented at the page buffer block 330 so as to communicate with the NPU, and the flash memory device 300 may provide the NPU with an excellent performance of the writing and reading of sequential data according to structural and operational characteristics.

In an exemplary embodiment, for data input and output synchronization, a part of the third pads 163 may be used to convey a synchronization signal. For example, the synchronization signal may be toggled when data are input from the NPU to the page buffer block 330 through the third pads 163, thus informing the page buffer block 330 of the data latch timing. Alternatively, the synchronization signal may be toggled when data are output from the page buffer block 330 to the NPU through the third pads 163, thus informing the NPU of the data latch timing.

Figure 8:
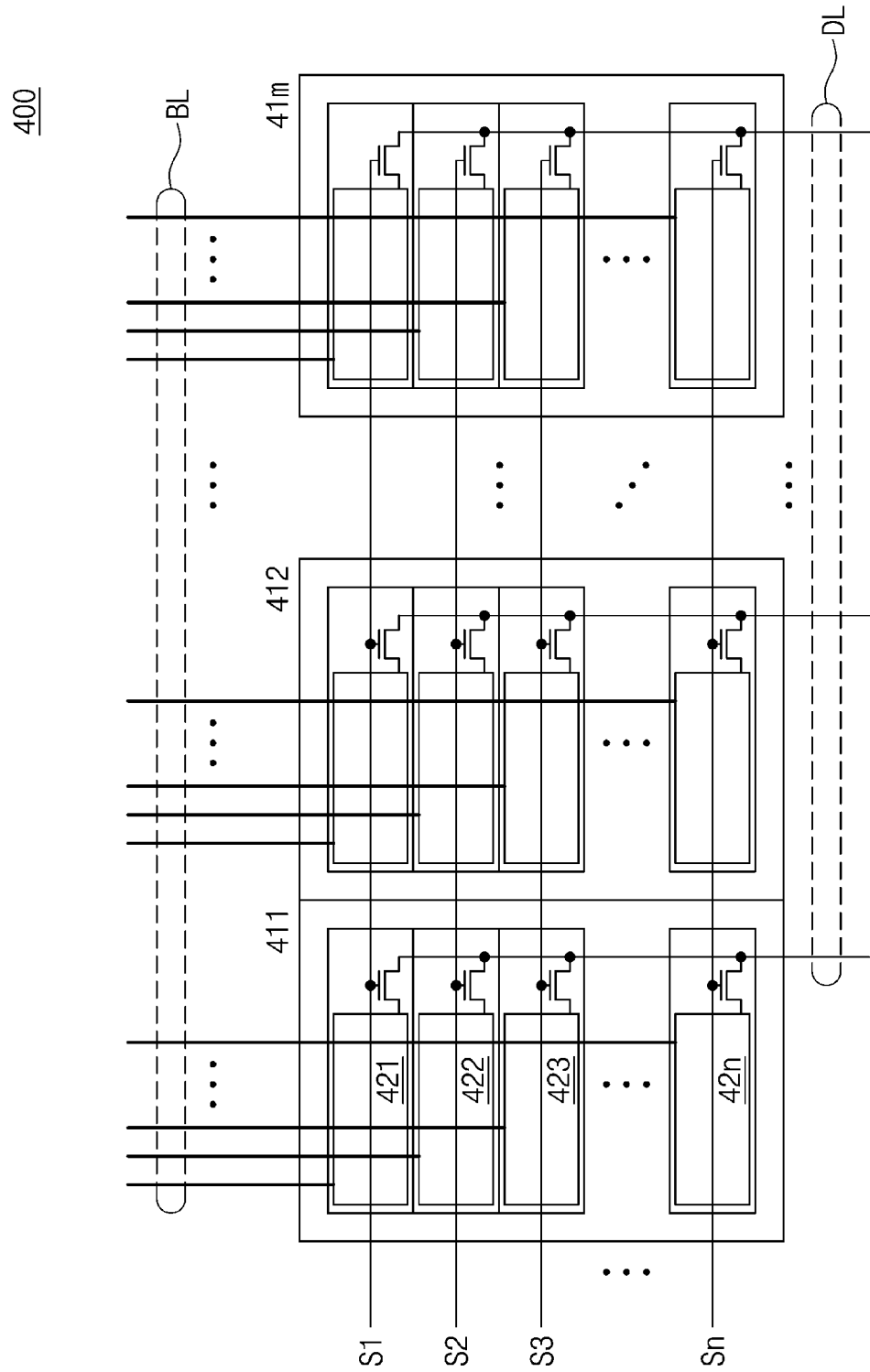
FIG. 8 illustrates a configuration of a page buffer block according to an exemplary embodiment.

FIG. 8 illustrates a configuration of a page buffer block 400 according to an exemplary embodiment. For example, the page buffer block 400 of FIG. 8 may correspond to the page buffer block 330 of FIG. 7. Referring to FIGS. 7 and 8, the page buffer block 400 may include first to m-th page buffer units 411 to 41m (m being a positive integer). Each of the first to m-th page buffer units 411 to 41m may be connected to one data line.

Each page buffer unit may include first to n-th page buffers 421 to 42n (n being a positive integer). In the first to m-th page buffer units 411 to 41m, the first page buffers 421 may be connected in common to a first signal line 51, the second page buffers 422 may be connected in common to a second signal line S2, the third page buffers 423 may be connected in common to a third signal line S3, and the n-th page buffers 42n may be connected in common to an n-th signal line Sn.

Each of the first to m-th page buffer units 411 to 41m may be connected to "n" bit lines and may be connected to one data line. That is, a ratio of the number of bit lines BL and the number of data lines DL may be n:1.

When the first signal line 51 is activated, each of the first to m-th page buffer units 411 to 41m may connect the first bit line of the corresponding bit lines to the corresponding data line. When the second signal line S2 is activated, each of the first to m-th page buffer units 411 to 41m may connect the second bit line of the corresponding bit lines to the corresponding data line.

When the third signal line S3 is activated, each of the first to m-th page buffer units 411 to 41m may connect the third bit line of the corresponding bit lines to the corresponding data line. When the n-th signal line Sn is activated, each of the first to m-th page buffer units 411 to 41m may connect the n-th bit line of the corresponding bit lines to the corresponding data line.

In the case where it is difficult to implement the third pads 163 at all the page buffers belonging to the page buffer block 400 (e.g., due to an issue such as space or costs), as illustrated in FIG. 8, the n:1 relationship (e.g., multiplexing in case of receiving data and demultiplexing in the case of outputting data) may be provided between the bit lines BL and the data lines DL.

In the structure of FIG. 8, data may be input to the page buffer block 330 through "n" cycles. Also, data may be output from the page buffer block 330 through "n" cycles.

In an exemplary embodiment, the bit lines BL are illustrated by relatively bold lines, and the data lines DL are illustrated by relatively thin lines. The bit lines BL may have an influence of a write operation and a read operation of the memory cell array 310, and in some cases, a high voltage may be generated.

In contrast, the data lines DL may have no influence of a write operation and a read operation of the memory cell array 310, and a high voltage may not be generated. Accordingly, as signal lines to be connected with the third pads 163, the data lines DL passing through page buffers may be more preferred than the bit lines BL.

Figure 9:
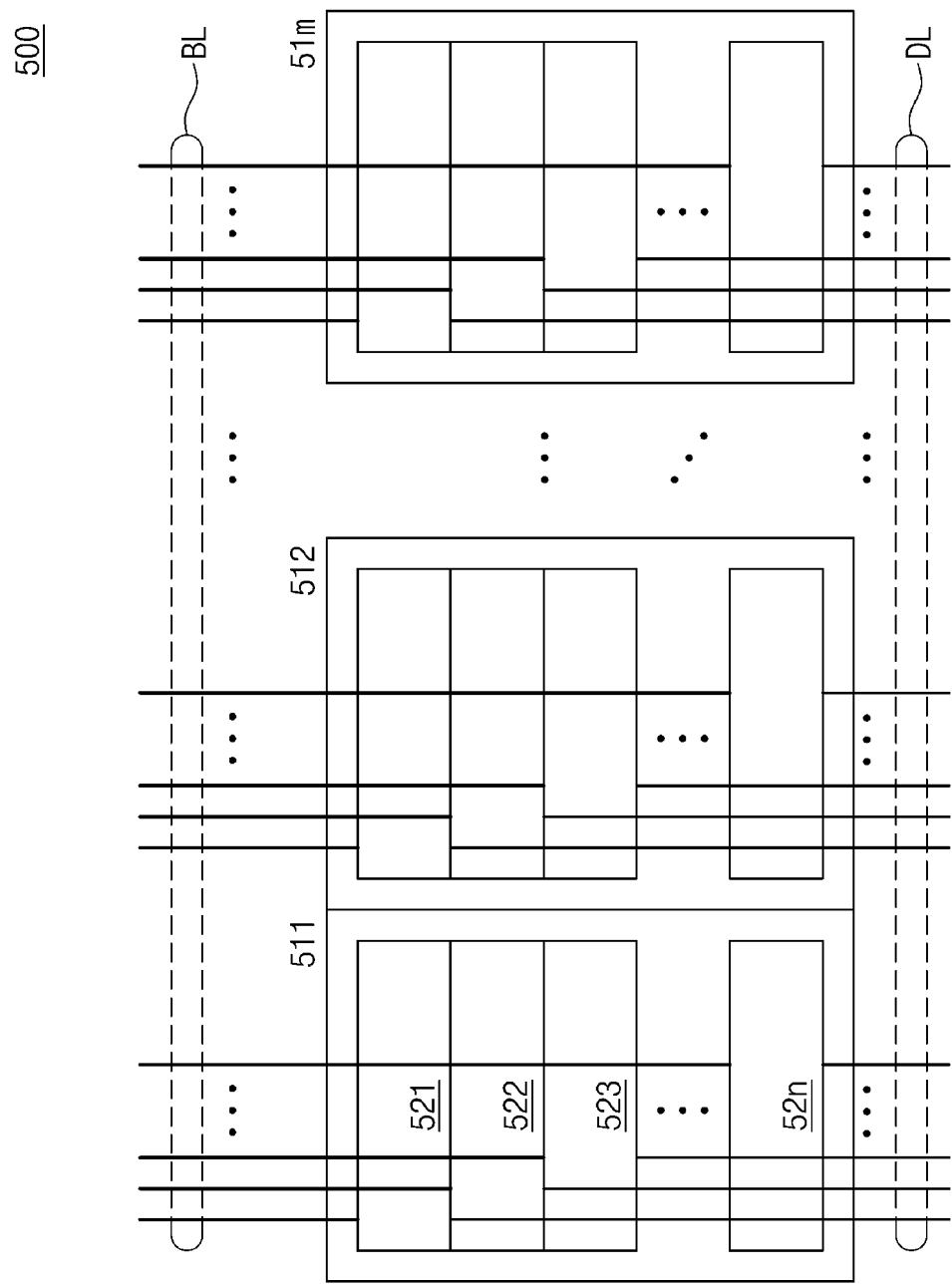
FIG. 9 illustrates a configuration of a page buffer block according to an exemplary embodiment.

FIG. 9 illustrates a configuration of a page buffer block 500 according to an exemplary embodiment. For example, the page buffer block 500 of FIG. 9 may correspond to the page buffer block 330 of FIG. 7. Referring to FIGS. 7 and 9, the page buffer block 500 may include first to m-th page buffer units 511 to 51m (m being a positive integer).

Each page buffer unit may include first to n-th page buffers 521 to 52n (n being a positive integer). The first to n-th page buffers 521 to 52n may be connected to different data lines. That is, the bit lines BL may be respectively connected to the data lines, the number of which is equal to the number of bit lines BL, through the page buffer block 500 and may be connected to the third pads 163, the number of which is equal to the number of bit lines/data lines.

In the structure of FIG. 9, data may be input to the page buffer block 500 through one cycle. Also, data may be output from the page buffer block 500 through one cycle.

Figure 10:
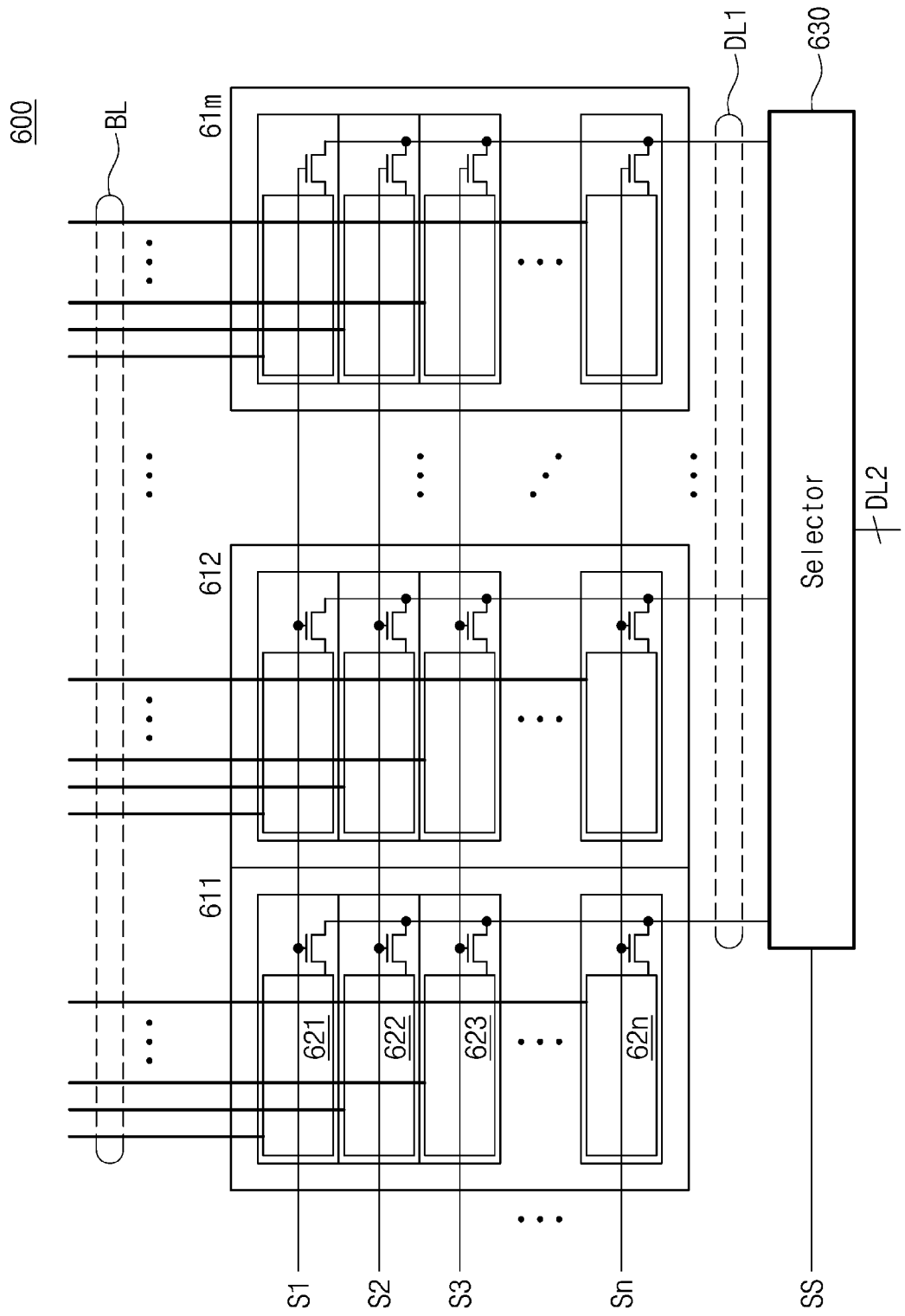
FIG. 10 illustrates a configuration of a page buffer block according to an exemplary embodiment.

FIG. 10 illustrates a configuration of a page buffer block 600 according to an exemplary embodiment. For example, the page buffer block 600 of FIG. 10 may correspond to the page buffer block 330 of FIG. 7. Referring to FIGS. 7 and 10, the page buffer block 600 may include first to m-th page buffer units 611 to 61m (m being a positive integer). The first to m-th page buffer units 611 to 61m may be identical to the first to m-th page buffer units 411 to 41m of FIG. 8 except that the first to m-th page buffer units 611 to 61m are connected to first data lines DL1, not the data lines DL.

As compared to the page buffer block 400 of FIG. 8, the page buffer block 600 of FIG. 10 may further include a selector 630 connected to the first data lines DL1. The selector 630 may operate in response to a selection signal SS. As described above with reference to the first to m-th page buffer units 411 to 41m in FIG. 8, in response to the selection signal SS, the selector 630 may connect the first data lines DL1 with second data lines DL2 in a k:1 relationship (k being a positive integer) (e.g., through multiplexing in the case of receiving data and demultiplexing in the case of outputting data).

That is, the page buffer block 600 may be implemented to provide a hierarchical structure for providing an n:1 relationship (e.g., multiplexing in the case of receiving data and demultiplexing in the case of outputting data) at the first to m-th page buffer units 611 to 61m and providing a k:1 relationship (e.g., multiplexing in the case of receiving data and demultiplexing in the case of outputting data) at the selector 630. The second data lines DL2 may be connected to the third pads 163. Finally, the bit lines BL may be connected to the third pads 163 through an nk:1 relationship (e.g., through multiplexing in the case of receiving data and demultiplexing in the case of outputting data).

Figure 11:
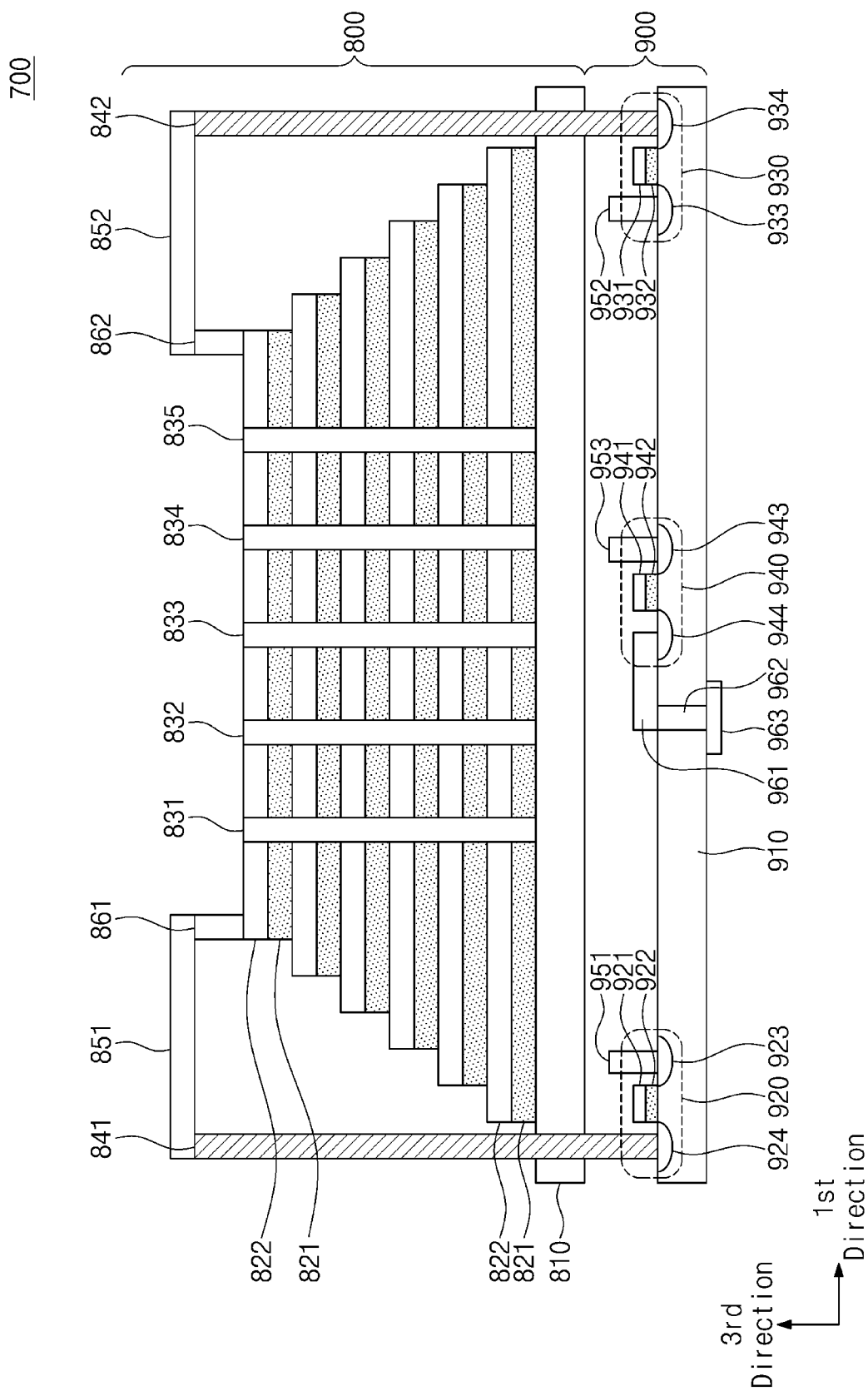
FIG. 11 illustrates an example of a flash memory device according to an exemplary embodiment implemented based on a cell-over-peri (COP) structure.

FIG. 11 illustrates a flash memory device 700 according to an exemplary embodiment implemented based on a COP structure. Referring to FIGS. 1 and 11, the flash memory device 700 may include a first layer 800 and a second layer 900.

The second layer 900 may include a first active area 910, and elements 920, 930, and 940 on the first active area 910. The first active area 910 may be formed or provided at a semiconductor substrate. The element 920 may be a transistor (e.g., first transistor 920) connected to a first through via 841, and the element 930 may be a transistor (e.g., second transistor 930) connected to a second through via 842. The element 940 may be a third transistor connected to a pad 963. The pad 963 may be included in one of the first, second, and third pads 161, 162, and 163.

The first transistor 920 may include a gate 921, an insulating layer 922, a first junction 923, and a second junction 924. The second transistor 930 may include a gate 931, an insulating layer 932, a first junction 933, and a second junction 934. The third transistor 940 may include a gate 941, an insulating layer 942, a first junction 943, and a second junction 944.

The first junction 923 of the first transistor 920 may be connected to a first peripheral circuit via 951. The first peripheral circuit via 951 may be connected to a wire. The second junction 924 of the first transistor 920 may be connected to the first through via 841. For example, the first through via 841 may be a through hole via (THV).

The first junction 933 of the second transistor 930 may be connected to a second peripheral circuit via 952. The second peripheral circuit via 952 may be connected to a wire. The second junction 934 of the second transistor 930 may be connected to the second through via 842. For example, the second through via 842 may be a through hole via (THV).

The first junction 943 of the third transistor 940 may be connected to a third peripheral circuit via 953. The third peripheral circuit via 953 may be connected to a wire. The second junction 944 of the third transistor 940 may be connected to a third through via 962 through a conductive connection 961.

In an exemplary embodiment, only elements connected with the first through via 841, the second through via 842, and the third through via 962 from among elements of the second layer 900 are illustrated in FIG. 11. Additional elements not illustrated in FIG. 11 may be added to the second layer 900.

The first layer 800 may include a second active area 810 and a vertical structure on the second active area 810. The vertical structure may have a structure in which a pair of an insulating layer 821 and a conductive layer 822 is sequentially stacked on the second active area 810 along the third direction.

Vertical channels 831, 832, 833, 834, and 835 may penetrate the vertical structure in the third direction. The vertical channels 831, 832, 833, 834, and 835 may form cell transistors (e.g., including memory cell transistors (or memory cells) and selection transistors) stacked in the third direction together with the vertical structure.

The vertical structure may have a stair shape in which a width in the first direction gradually decreases as it goes in the third direction. In an exemplary embodiment, an information storage layer including a silicon oxide layer, a silicon nitride layer, and a silicon oxide layer may be formed between the vertical structure and the vertical channels 831, 832, 833, 834, and 835. The conductive layers 822 of the vertical structure may be wires that are extended along the first direction and connect the cell transistors.

The first through via 841 may penetrate the second active area 810 and may be extended in the third direction. The first through via 841 may be connected with a first memory cell via 861 on the uppermost conductive layer 822 through a first upper conductive layer 851. The second through via 842 may penetrate the second active area 810 and may be extended in the third direction. The second through via 842 may be connected with a second memory cell via 862 on the uppermost conductive layer 822 through a second upper conductive layer 852.

The first and second through vias 841 and 842 are illustrated in FIG. 11, but a plurality of through vias connecting the second layer 900 to the conductive layers 822 of the vertical structure may be added. Also, the one pad 963 (or solder bump) and the third through via 962 are illustrated, but a plurality of pads (or solder bumps) and through vias connecting the second layer 900 to the third pads 163 may be added.

Figure 12:
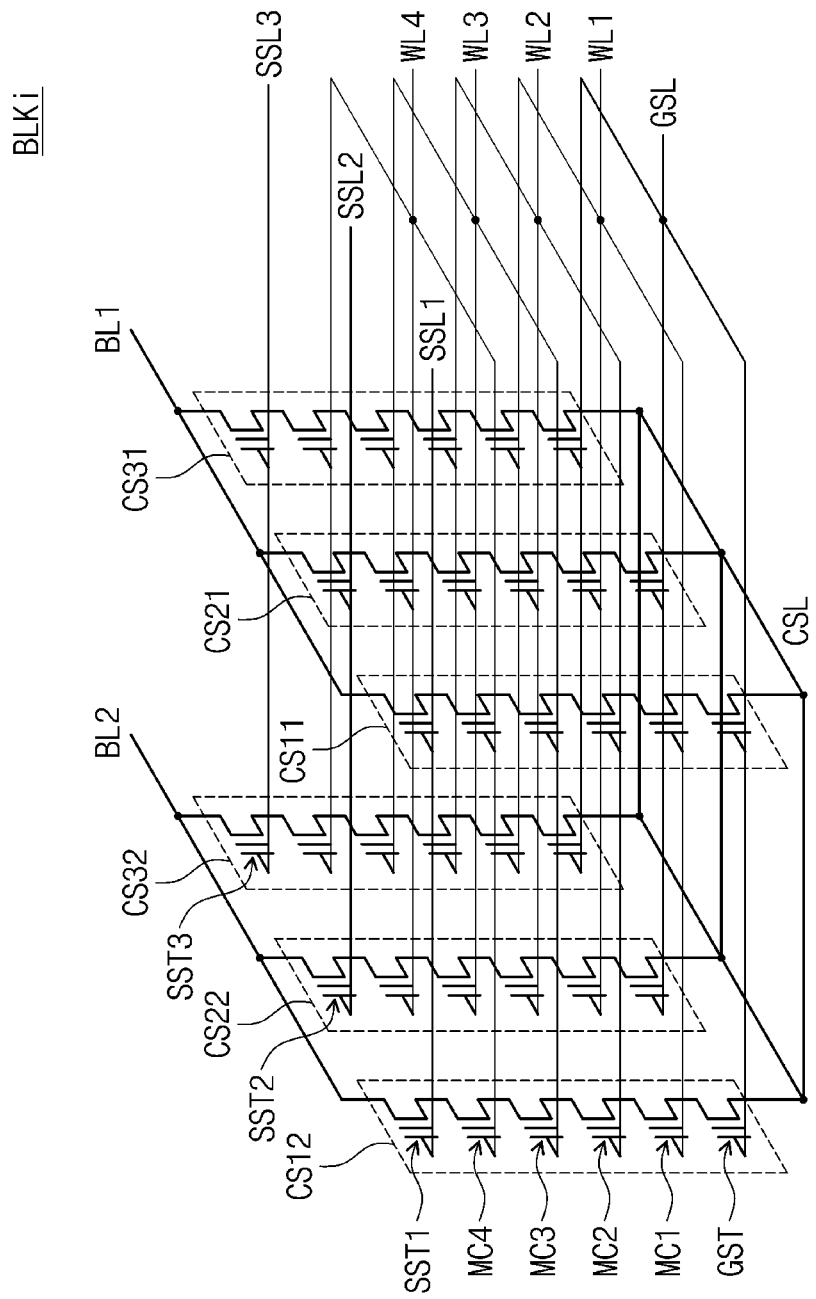
FIG. 12 illustrates an example of a circuit diagram of a memory cell array according to an exemplary embodiment.

FIG. 12 illustrates an example of a circuit diagram of a portion of one memory block BLKi in the memory cell array 310. Referring to FIGS. 7, 11, and 12, a plurality of cell strings CS11, CS12, CS21, CS22, CS31, and CS32 may be disposed on the second active area 810. The plurality of cell strings CS11, CS12, CS21, CS22, CS31, and CS32 may be connected in common to a common source line CSL formed on (or in) the second active region 810.

The cell strings CS11, CS21, and CS31 may be connected to a first bit line BL1, and the cell strings CS12, CS22, and CS32 may be connected to a second bit line BL2. The cell strings CS11, CS12, CS21, CS22, CS31, and CS32 are implemented in a plurality of rows and a plurality of columns. In an exemplary embodiment, a direction in which the bit lines BL1 and BL2 are extended may be a column direction, and a direction in which string selection lines SSL1, SSL2, and SSL3 are extended may be a row direction.

Cell strings of each row may be connected in common to the ground selection line GSL and may be connected to the corresponding string selection line of first to third string selection lines SSL1 to SSL3. Cell strings of each column may be connected to the corresponding bit line of the first and second bit lines BL1 and BL2.

Each cell string may include at least one ground selection transistor GST connected to the ground selection line GSL, a plurality of memory cell transistors MC1 to MC4 respectively connected to a plurality of word lines WL1 to WL4, and a string selection transistor SST1, SST2, or SST3 connected to the corresponding string selection line SSL1, SSL2, or SSL3.

The ground selection transistors GST may correspond to the vertical channels 831 to 835 and portions, which are adjacent to the vertical channels 831 to 835, of the lowermost conductive layer 822. The ground selection line GSL may correspond to the lowermost conductive layer 822. Likewise, the first to fourth memory cell transistors MC1 to MC4 and the word lines WL1 to WL4 may correspond to the second to fifth conductive layers 822 from the lowermost layer and the vertical channels 831 to 835.

The uppermost conductive layer 822 may be divided into three portions respectively corresponding to the first to third string selection lines SSL1 to SSL3. The first to third string selection lines SSL1 to SSL3 may correspond to the divided portions of the uppermost conductive layer 822 and the vertical channels 831 to 835.

The example illustrated in FIG. 12 includes six cell transistors in one cell string. It is understood, however, that the number of cell transistors included in one cell string is not limited. As the number of layers of the vertical structure increases, the number of cell transistors included in one cell string may increase.

Also, the number of cell transistors to be used as a ground selection transistor, a memory cell transistor, or a string selection transistor from among cell transistors belonging to one cell string may be variable. Some of cell transistors belonging to one cell string may be used as dummy memory cell transistors that do not store data.

Figure 13:
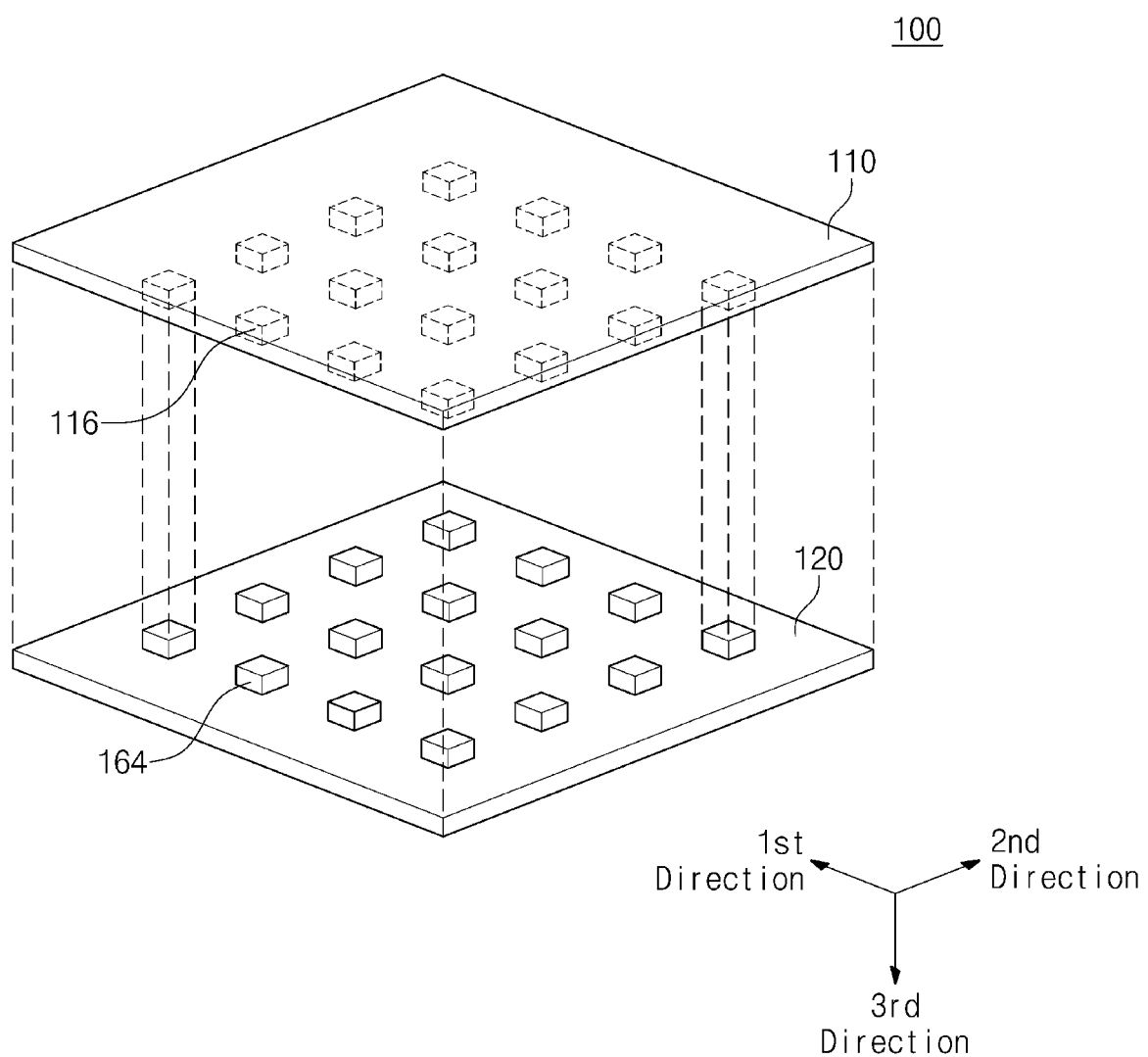
FIG. 13 illustrates an example in which a flash memory device according to an exemplary embodiment is implemented by bonding.

FIG. 13 illustrates an example in which a flash memory device 100 according to an exemplary embodiment is implemented by bonding. Referring to FIGS. 11 and 13, the first layer 110 of FIG. 13 may correspond to the first layer 800 of FIG. 11 rotated around the second direction by approximately 180 degrees. The first memory cell via 861 and the second memory cell via 862 may not be connected with the first and second through vias 841 and 842, but the first memory cell via 861 and the second memory cell via 862 may extend in a direction perpendicular to the second active area 810 so as to connect with pads (or solder bumps).

Also, the remaining conductive layers 822 may extend in the direction perpendicular to the second active area 810 so as to be connected with pads (or solder bumps). Also, the vertical channels 831 to 835 may extend in the direction perpendicular to the second active area 810 so as to be connected with pads (or solder bumps). Pads 116 (or solder bumps) of the first layer 110 of FIG. 13 may be connected with the conductive layers 822 and the vertical channels 831 to 835 of the first layer 800 of FIG. 11.

The second layer 120 of FIG. 13 may have a shape of the second layer 900 of FIG. 11. The first and second transistors 920 and 930 of FIG. 11 may not be connected with the first and second through vias 841 and 842, but connected with conductors extended in a direction perpendicular to the first active area 910 so as to connect with pads 164 (or solder bumps) of FIG. 13.

The flash memory device 100 may be implemented by connecting the pads 116 of the first layer 110 and the pads 164 of the second layer 120 through the bonding (e.g., at a wafer level).

Figure 14:
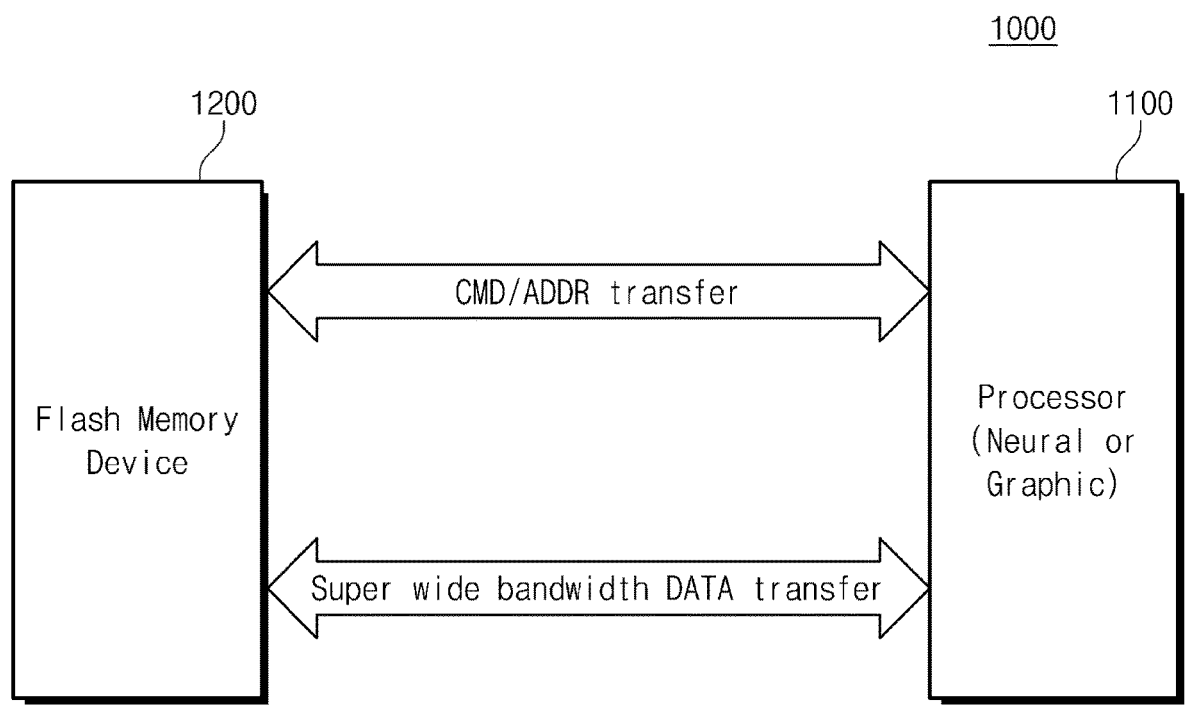
FIG. 14 is a block diagram illustrating a computing device according to an exemplary embodiment.

FIG. 14 is a block diagram illustrating a computing device 1000 according to an exemplary embodiment. Referring to FIG. 14, the computing device 1000 may include a processor 1100 and a flash memory device 1200. For example, the processor 1100 may include a neural processor or a graphic processor.

The processor 1100 and the flash memory device 1200 may be coupled according to the example described with reference to FIG. 6. The processor 1100 may correspond to the NPU 200 of FIG. 6, and the flash memory device 1200 may correspond to the flash memory device 100 of FIG. 6.

The flash memory device 1200 may provide the processor 1100 with a path for an input and output of data via the third pads 163 connected to the data lines DL of the page buffer block 330 (refer to FIG. 7). Accordingly, a data transfer having a super wide bandwidth may be implemented between the processor 1100 and the flash memory device 1200.

The flash memory device 1200 may provide the processor 1100 with the first pads 161 and the second pads 162 supporting a transfer of the command CMD and the address ADDR according to an interface of a general flash memory device. Accordingly, costs (or a time or resources) necessary to design an additional interface are not required.

Figure 15:
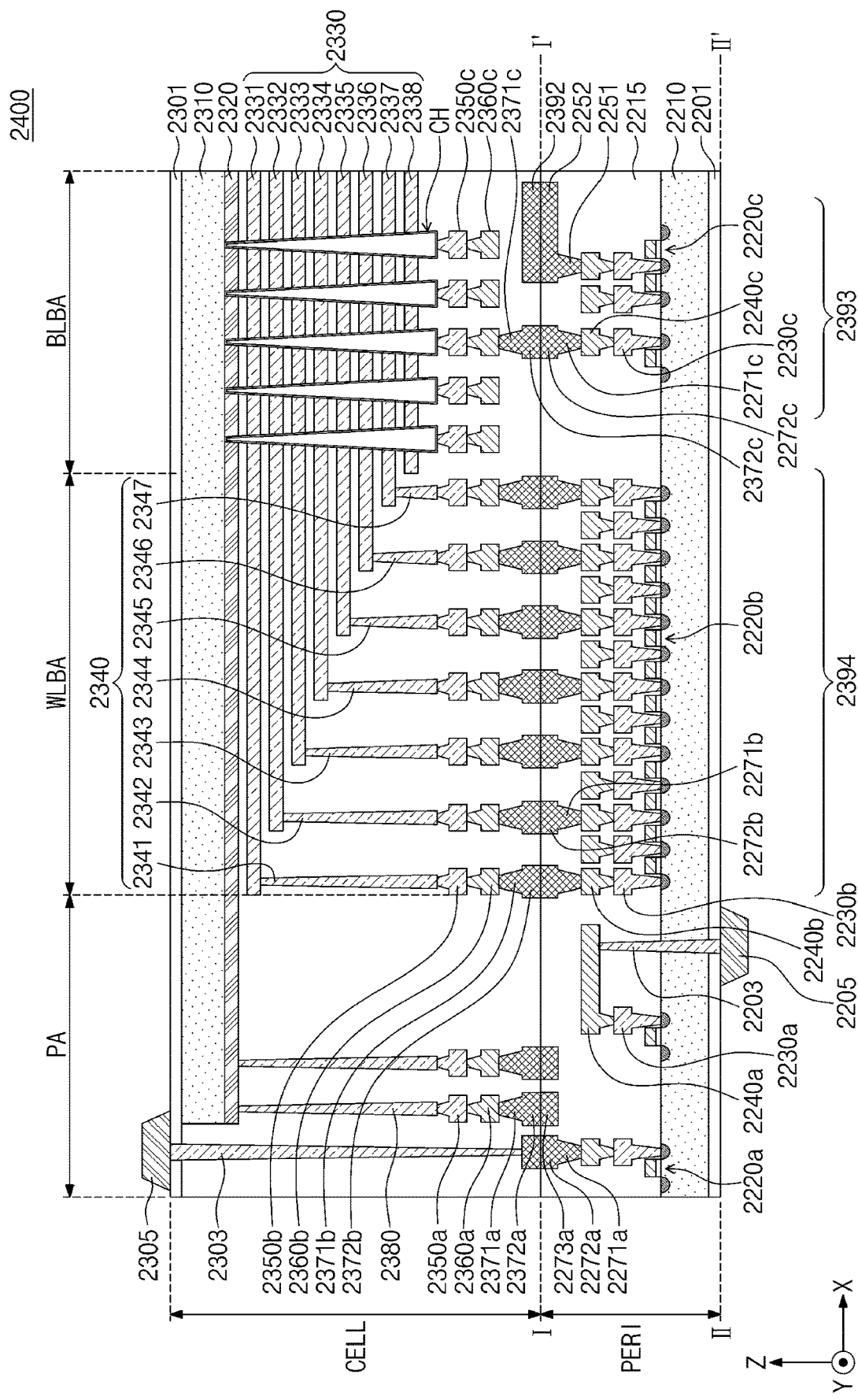
FIG. 15 is a diagram illustrating an exemplary nonvolatile memory device including the flash memory device.

FIG. 15 is a diagram illustrating an exemplary nonvolatile memory device 2400 including the flash memory device. In FIG. 15, the X-direction may correspond to an opposite direction of the second direction. The Y-direction may correspond to an opposite direction of the second direction. The Z-direction may correspond to the third direction. Referring to FIG. 15, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrate in FIG. 15, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 15, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305, which may include the first pads 162, the second pads, and the third pads, may be disposed in the external pad bonding area PA. Referring to FIG. 15, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 15, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303 and the lower bonding metals 2271a and 2272a of the peripheral circuit region PERI.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 15, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305.

According to embodiments, the first input-output pad 2205 and the second input-output pad 2305 may be selectively formed. For example, the memory device 2400 may include only the first input-output pad 2205 disposed on the first substrate 2210 or the second input-output pad 2305 disposed on the second substrate 2310. Alternatively, the memory device 2400 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2400 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PEM, a reinforcement metal pattern having the same shape as the metal pattern may be formed in an uppermost metal layer in another one of the cell region CELL and the peripheral circuit region PEM, and a contact may not be formed on the reinforcement metal pattern.

In the above description of exemplary embodiments, some components are described by using the terms "first," "second," "third," and the like. However, the terms "first," "second," "third," and the like may be used to distinguish components from each other and do not otherwise limit the inventive concept(s). For example, the terms "first," "second," "third," and the like do not designate an order or a numerical meaning of any form.

In the above description of exemplary embodiments, components may be described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits that are implemented with semiconductor elements in an integrated circuit or circuits that are enrolled as intellectual property (IP).

According to exemplary embodiments, a flash memory device may receive a command, an address, and control signals through a general input and output interface and may exchange data through pads directly connected with data lines. The pads of the flash memory device may be directly connected with pads of a processor. Accordingly, there are provided a flash memory device and a computing device capable of providing a super wide bandwidth on data, with an interface change of a command, an address, and control signals suppressed.

While exemplary embodiments have been described with reference to the accompanying drawings, it will be apparent to those of ordinary skill in the art that various changes and modifications may be made thereto without departing from the spirit and scope of the inventive concept(s) as set forth in the following claims.

What is claimed is:

1. A flash memory device comprising:
   first pads configured to be bonded to an external semiconductor chip and configured to receive at least one of a command, an address and control signals from the external semiconductor chip;
   second pads configured to be bonded to the external semiconductor chip;
   a memory cell array including memory cells;
   a row decoder block connected to the memory cell array through word lines, and configured to select one of the word lines based on the address provided to the row decoder block;
   a buffer block configured to store the command and the address and to provide the address to the row decoder block;
   a page buffer block connected to the memory cell array through bit lines, connected to the second pads through data lines without passing through the buffer block, and configured to exchange data signals with the external semiconductor chip through the data lines and the second pads; and
   a control logic block configured to receive the command from the buffer block, to receive the control signals from the external semiconductor chip, and to control the row decoder block and the page buffer block based on the command and the control signals.

2. The flash memory device of claim 1, wherein:
   the page buffer block includes page buffer units each connected to two or more bit lines of the bit lines and connected to one data line of the data lines;
   each of the page buffer units includes two or more page buffers respectively connected to the two or more bit lines, of the bit lines, and connected in common to the one data line, of the data lines; and
   the two or more page buffers are configured to be electrically connected to the one data line in turn.

3. The flash memory device of claim 1, wherein the page buffer block includes page buffers respectively connected to the bit lines and respectively connected to the data lines.

4. The flash memory device of claim 1, wherein:
   the page buffer block includes page buffer units each connected to two or more bit lines, of the bit lines, and connected to one intermediate data line of intermediate data lines;
   each of the page buffer units includes two or more page buffers respectively connected to the two or more bit lines and connected in common to the one intermediate data line;
   the two or more page buffers are configured to be electrically connected to the one intermediate data line in turn; and
   the page buffer block further includes a selector configured to select a part of the intermediate data lines so as to be electrically connected with the data lines.

5. The flash memory device of claim 1, wherein the first pads and the second pads are configured to be connected with the external semiconductor chip through a wafer-to-wafer bonding.

6. The flash memory device of claim 1, further comprising:
   a peripheral circuit area provided on a first active area and in which the row decoder block, the buffer block, the page buffer block, and the control logic block are implemented; and a memory cell area which is provided on a second active area of the peripheral circuit area and in which the memory cell array is implemented, wherein the first pads and the second pads are provided under the first active area and penetrate the first active area so as to be electrically connected with the peripheral circuit area.

7. The flash memory device of claim 1, further comprising:
a peripheral circuit chip; and
a memory cell chip,
wherein the peripheral circuit chip comprises a first active area on which the row decoder block, the buffer block, the page buffer block, and the control logic block are implemented, and
wherein the memory cell chip comprises a second active area on which the memory cell array is implemented.

8. The flash memory device of claim 7, wherein the first pads and the second pads are provided under the first active area and penetrate the first active area so as to be electrically connected with the peripheral circuit chip.

9. The flash memory device of claim 8, wherein:
the peripheral circuit chip further comprises third pads provided on the row decoder block, the buffer block, the page buffer block, and the control logic block; and
the memory cell chip further comprises fourth pads provided on the memory cell array and configured to be bonded to the third pads.

10. The flash memory device of claim 1, wherein the page buffer block exchanges the data signals asynchronously with regard to the command and the address.

11. A flash memory device comprising:
first pads configured to be bonded to an external semiconductor chip and configured to receive at least one of a command, an address and control signals from the external semiconductor chip;
second pads configured to be bonded to the external semiconductor chip;
a memory cell region including first metal pads and a memory cell array including memory cells; and
a peripheral circuit region which includes second metal pads and is vertically connected to the memory cell region by the first metal pads and the second metal pads directly,
wherein the peripheral circuit region further includes:
a row decoder block connected to the memory cell array through word lines, and configured to select one of the word lines based on the address provided to the row decoder block;
a buffer block configured to store the command and the address and to provide the address to the row decoder block;
a page buffer block connected to the memory cell array through bit lines, connected to the second pads through data lines without passing through the buffer block, and configured to exchange data signals with the external semiconductor chip through the data lines and the second pads; and
a control logic block configured to receive the command from the buffer block, to receive the control signals from the external semiconductor chip, and to control the row decoder block and the page buffer block based on the command and the control signals,
wherein the first pads are separate and different from the first metal pads, and
wherein the second pads are separate and different from the second metal pads.

12. The flash memory device of claim 11, wherein:
the page buffer block includes page buffer units each connected to two or more bit lines of the bit lines and connected to one data line of the data lines;
each of the page buffer units includes two or more page buffers respectively connected to the two or more bit lines, of the bit lines, and connected in common to the one data line, of the data lines; and
the two or more page buffers are configured to be electrically connected to the one data line in turn.

13. The flash memory device of claim 11, wherein the page buffer block includes page buffers respectively connected to the bit lines and respectively connected to the data lines.

14. The flash memory device of claim 11, wherein:
the page buffer block includes page buffer units each connected to two or more bit lines, of the bit lines, and connected to one intermediate data line of intermediate data lines;
each of the page buffer units includes two or more page buffers respectively connected to the two or more bit lines and connected in common to the one intermediate data line;
the two or more page buffers are configured to be electrically connected to the one intermediate data line in turn; and
the page buffer block further includes a selector configured to select a part of the intermediate data lines so as to be electrically connected with the data lines.

15. The flash memory device of claim 11, wherein the first metal pads and the second metal pads are formed of copper.

16. The flash memory device of claim 11, wherein the first metal pads and the second metal pads are connected by bonding.

17. The flash memory device of claim 13, wherein the memory cell region is formed on a first wafer and the peripheral circuit region is formed on a second wafer.

18. The flash memory device of claim 11, wherein the page buffer block exchanges the data signals asynchronously with regard to the command and the address.

19. A computing device comprising:
a neural processor chip; and
a flash memory chip coupled to the neural processor chip,
wherein the flash memory chip comprises:
first pads bonded to the neural processor chip and configured to receive at least one of a command, an address and control signals from the neural processor chip;
second pads bonded to the neural processor chip;
a memory cell array including memory cells;
a row decoder block connected to the memory cell array through word lines, and configured to select one of the word lines based on the address provided to the row decoder block;
a buffer block configured to store the command and the address and to provide the address to the row decoder block;
a page buffer block connected to the memory cell array through bit lines, connected to the second pads through data lines without passing through the buffer block, and configured to exchange data signals with the neural processor chip through the data lines and the second pads; and
a control logic block configured to receive the command from the buffer block, to receive control signals from the neural processor chip, and to control the row decoder block and the page buffer block based on the command and the control signals.

20. The computing device of claim 19, wherein the first pads transfer the at least one of the command, the address and the control signals in units of a byte, and
the second pads exchange the data signals in units of one hundred bytes or more.

\* \* \* \* \*